United States Patent [19]

Smalley

[11] Patent Number: 4,612,498

[45] Date of Patent: Sep. 16, 1986

[54] INDUCTION FURNACE FAULT LOCATOR

[76] Inventor: Daniel S. Smalley, 15640 Colfax Cove, Big Rapids, Mich. 49307

[21] Appl. No.: 722,523

[22] Filed: Apr. 12, 1985

Related U.S. Application Data

[62] Division of Ser. No. 405,754, Aug. 6, 1982, Pat. No. 4,525,665.

[51] Int. Cl.⁴ .................... G01R 31/08; G06F 15/20
[52] U.S. Cl. ........................ 324/52; 324/55; 324/158 R; 364/571; 340/655
[58] Field of Search ................. 364/571; 361/47, 54, 361/42, 49, 50; 340/650, 655; 324/51, 52, 55, 158 R, 158 MG, 140 D; 179/175.3 F

[56] References Cited

U.S. PATENT DOCUMENTS

| | | | |
|---|---|---|---|
| 3,183,294 | 5/1965 | Kasper | 13/27 |
| 3,331,909 | 7/1967 | Kasper | 13/27 |
| 3,456,061 | 7/1969 | Hoff | 13/26 |
| 3,478,155 | 11/1969 | Segsworth | 13/26 |
| 3,539,693 | 11/1970 | Elischer | 13/26 |
| 3,588,611 | 6/1971 | Lambden | 317/31 |
| 3,701,927 | 10/1972 | Jenkinson | 317/16 |
| 3,723,864 | 3/1973 | Ricard | 324/52 |
| 3,775,676 | 11/1973 | Harroid et al. | 324/52 |
| 3,800,215 | 3/1974 | Souillard | 324/52 |
| 3,821,456 | 6/1974 | Havas | 13/26 |
| 3,867,563 | 2/1975 | Laflin | 13/27 |
| 3,898,366 | 8/1975 | Aurini | 13/35 |
| 3,927,369 | 12/1975 | Billeter et al. | 324/58.5 C |
| 4,004,219 | 1/1977 | Tiuri et al. | 324/58.5 A |
| 4,005,363 | 1/1977 | Mifflin | 324/58.5 B |
| 4,037,044 | 7/1977 | Havas | 13/26 |

(List continued on next page.)

FOREIGN PATENT DOCUMENTS

| | | |
|---|---|---|
| 0013104 | 7/1980 | European Pat. Off. ...... 179/173.3 P |
| 840568 | 7/1949 | Fed. Rep. of Germany . |
| 2450493 | 4/1976 | Fed. Rep. of Germany . |
| 2602615 | 7/1977 | Fed. Rep. of Germany . |
| 493892 | 10/1938 | United Kingdom . |

OTHER PUBLICATIONS

Maloney, Locating Cable Faults, IA-9, IEEE Transactions on Industry Applications, 380 (1973).
Nirrengarten, Fault Location with Direct Current on Extraneously Disturbed Weak-Current Cables, 24, Elektrotechnische Zeitschrift, 563 (1973).
Herrick: "Instruments and Measurements for Electronics"—McGraw-Hill, 1972—p. 183.

Primary Examiner—Reinhard J. Eisenzopf
Assistant Examiner—Jose M. Solis
Attorney, Agent, or Firm—Price, Heneveld, Huizenga & Cooper

[57] ABSTRACT

The specification discloses a computerized monitor for a coreless induction furnace. The monitor includes a first potential transformer connected across the coil and a second potential transformer connected between one end of the coil and an electric ground. The relative location of a ground fault along the length of the coil is approximated by computing the ratio of the transformer outputs. An impedance variation look-up table is included to provide correction factors for the approximated location to compensate for variations in impedance along the length of the coil. The monitor further includes a first current transformer in the coil power line and a second current transformer in the melt bath ground. Internal ground faults are detected by computing the phase difference between the coil and ground currents. A graphic representation of the furnace is also generated to illustrate the location of the ground fault with respect to turns and yokes of the coil. The monitor also calculates liner wear by determining melt bath volume, which is inversely proportional to melt bath resistance, which in turn is proportional to coil resistance. If the furnace being monitored is provided with more than one coil, a differential current transformer is connected across each coil to detect the fault grounded coil when the transformer associated with the faulted coil exhibits a substantially nonzero output.

10 Claims, 22 Drawing Figures

U.S. PATENT DOCUMENTS

| | | | |
|---|---|---|---|
| 4,041,381 | 8/1977 | Hwa | 324/52 |
| 4,063,160 | 12/1977 | Lanz et al. | 324/52 |
| 4,090,127 | 5/1978 | Giustini | 324/62 |
| 4,107,778 | 8/1978 | Nii et al. | 364/492 |
| 4,139,723 | 2/1979 | Havas | 13/26 |
| 4,151,459 | 4/1979 | Fayolle et al. | 324/52 |
| 4,165,482 | 8/1979 | Gale | 324/52 |
| 4,186,338 | 1/1980 | Fichtenbaum | 324/52 |
| 4,200,836 | 4/1980 | Okada et al. | 324/51 |
| 4,230,982 | 10/1980 | De Mesmaeker | 324/52 |
| 4,238,726 | 12/1980 | Ichijo | 324/57 R |
| 4,241,306 | 12/1980 | Bump | |
| 4,248,625 | 2/1981 | Tamura et al. | 75/41 |
| 4,269,397 | 5/1981 | Strimple et al. | 266/44 |
| 4,280,038 | 7/1981 | Havas et al. | 219/10.77 |
| 4,281,386 | 7/1981 | Kondow et al. | 364/492 |
| 4,282,479 | 8/1981 | Deboo et al. | 324/51 |
| 4,290,008 | 9/1981 | Hoshino et al. | 324/57 R |
| 4,303,984 | 12/1981 | Houvig | 364/571 |
| 4,307,267 | 12/1981 | Peoples | 179/175.3 R |
| 4,307,336 | 12/1981 | Bonanomi | 324/57 R |
| 4,314,199 | 2/1982 | Yamaura et al. | 324/52 |
| 4,398,232 | 8/1983 | Elmore | |
| 4,418,392 | 11/1983 | Hata | 364/571 |
| 4,446,421 | 5/1984 | Berde | 324/52 |

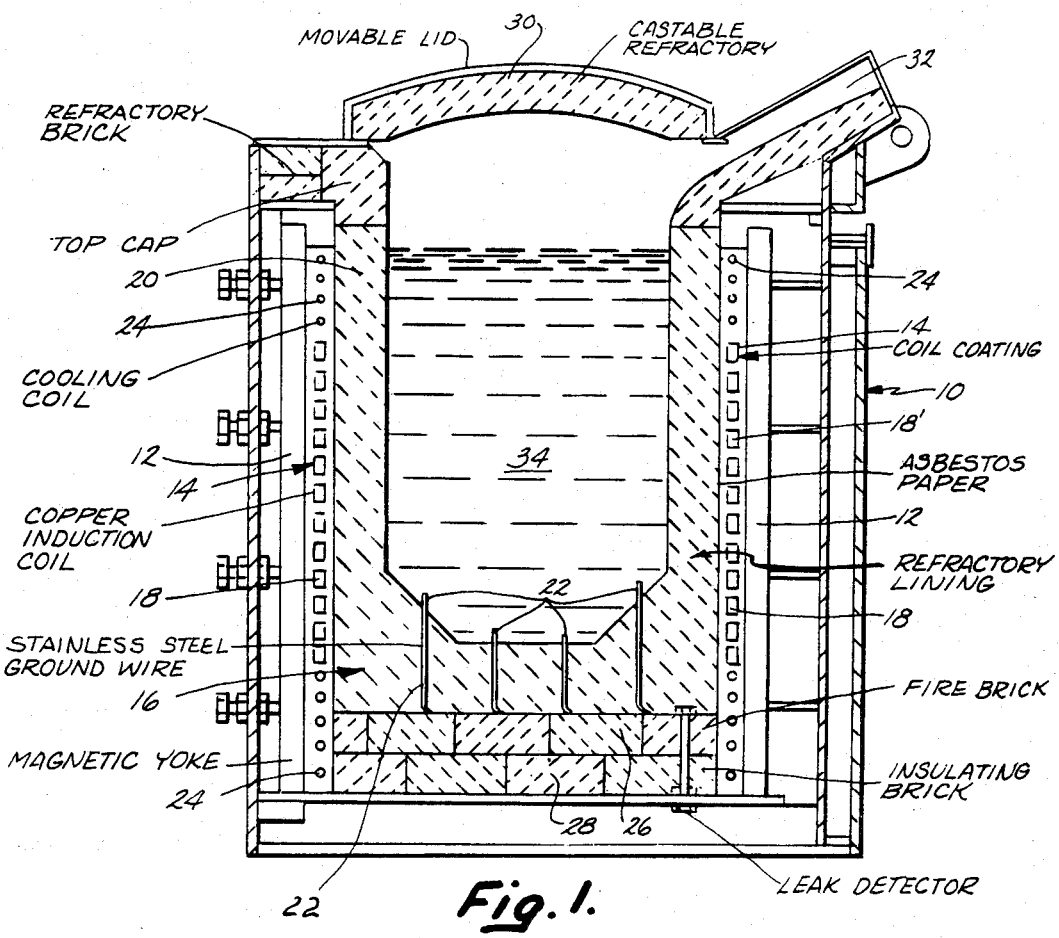
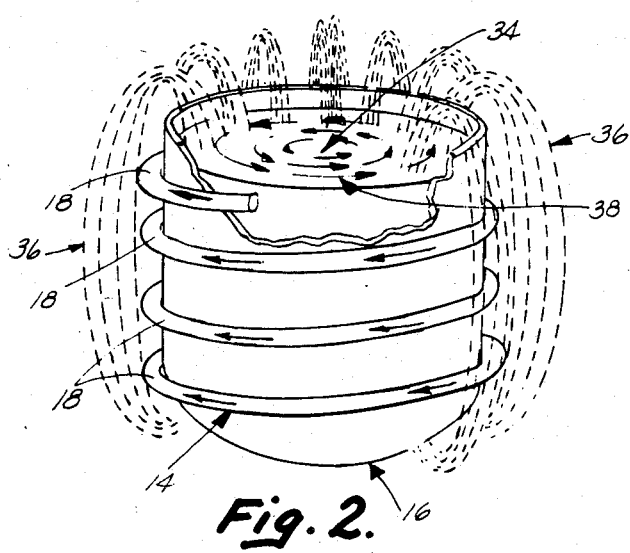
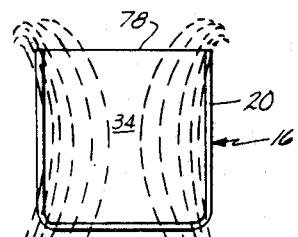
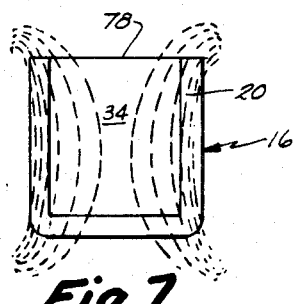

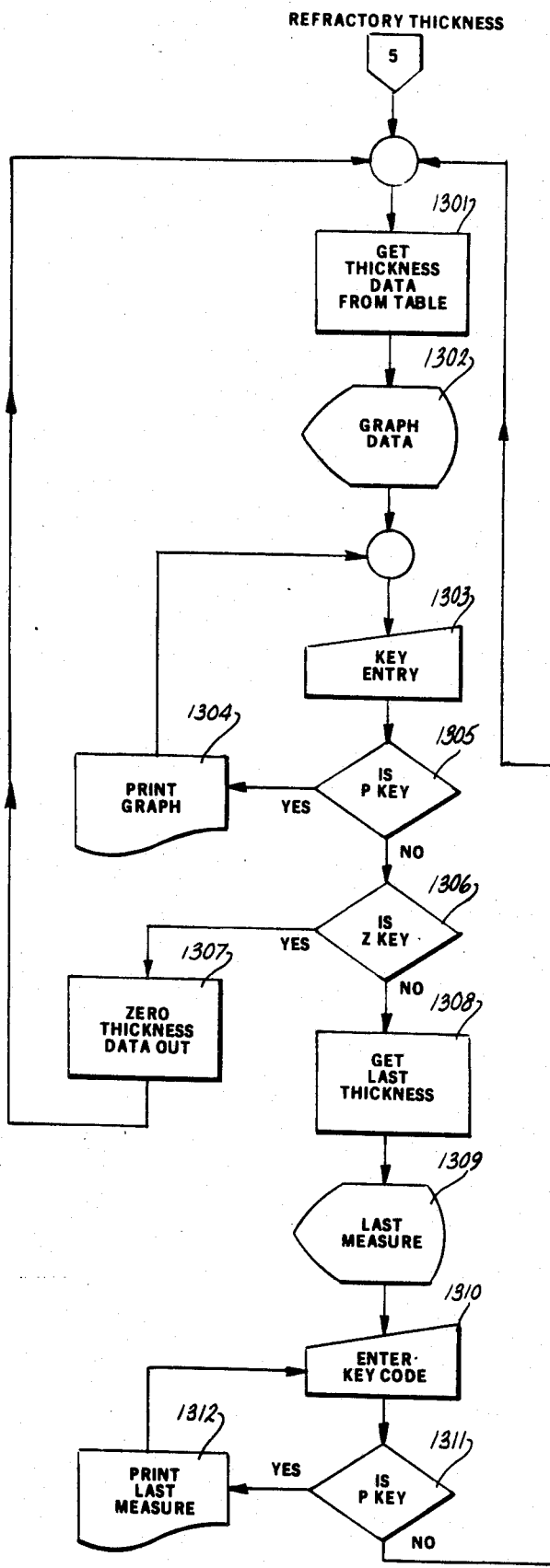
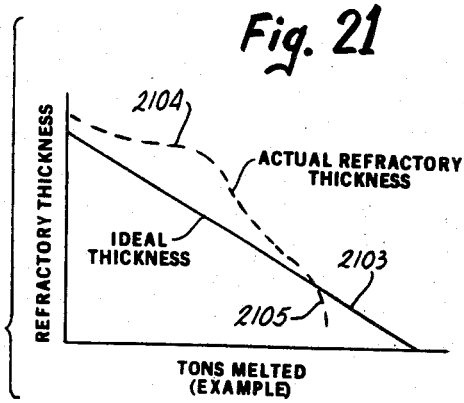
Fig. 21
Fig. 13.

SAMPLE OF COIL MAP

SAMPLE OF CLOSE-UP MAP

INDUCTION FURNACE FAULT LOCATOR

BACKGROUND OF THE INVENTION

The present invention relates to induction furnaces, and more particularly to induction furnace monitoring equipment.

Coreless induction furnaces have long been used for the heating and melting of metals. The more common metals heated are alloys of iron, steel, copper, brass and aluminum; however, other highly conductive materials can be melted using the induction principle.

An induction furnace comprises a refractory lining to contain the melt bath of metal to be heated, a power coil surrounding the refractory lining, and a plurality of magnetic yokes for concentrating the magnetic field established by the coil.

The power coil includes a plurality of turns and is typically fabricated of copper or aluminum. The coil carries large electric current which establishes a magnetic field which in turn induces electric currents, called eddy currents, in the molten metal bath. The power coils can have a variety of configurations. Some furnaces have single coils with typically 10 to 35 turns. Other furnaces have more than one coil, and yet other furnaces have concurrently wound coils. The power coils are connected to power sources of various voltages and frequencies, which can be either single phase or multi-phase.

The power coil is surrounded by a plurality of generally vertically oriented silicon steel columns called magnetic yokes, which are electrically grounded. The yokes support the power coil and provide a magnetic path for the alternating magnetic flux field which is created by the alternating electric current in the power coil.

For safety reasons, the melt bath is electrically grounded through rods which extend through the bottom of the refractory lining. The ground rods are fabricated of highly conductive, high temperature metal, which insures that the melt bath is at ground potential at all times.

Coreless induction furnaces have many problems causing unsafe conditions, costly downtime, lengthy maintenance inspections, and expensive repairs. First, when a conduction path occurs between a power coil and a ground, known in the art as a ground fault, an electric detection system senses the ground fault condition and trips, or turns off, the power supply. A ground fault condition can be caused by an object external to (i.e., outside) the coil touching both the coil and a grounded member of the furnace. Often, such an external ground fault is caused by a metal part wedged between a coil turn and one of the grounded magnetic yokes. An internal ground fault occurs when the melt bath penetrates the refractory lining and engages the coil. Because the bath is grounded, the coil is then also grounded through the melt bath. When a ground fault is detected, the fault must be located and cleared before the molten bath solidifies, typically 3 to 10 hours after power is lost. If the fault is not timely found, the melt bath must be drained. Currently, any ground fault, either external or internal, must be located by visually inspecting the coil. Visual inspection is inherently slow and consequently results in expensive losses in terms of production loss, heat energy loss, and possible refractory damage. Typical times required to find ground faults in medium to large furnaces (8 to 80 tons) range from 2 to 48 hours. Further, visual inspection does not readily reveal ground faults located behind magnetic yokes or those due to melt bath penetration through the insulative refractory lining.

Second, when a weak spot in the refractory occurs, the molten bath can penetrate the refractory and leak out past the power coil. This condition, referred to as runout, is an expensive and dangerous condition. Possibly both coil and structural damage can result, requiring excessive repair cost and time. An internal ground fault typically precedes a run-out. However, visual inspection of the coil when a ground fault is detected will not readily reveal whether the fault is external or internal. Consequently, the operator upon detecting a ground fault knows that a certain possibility exists that the fault is internal and might lead to a run-out. Upon detecting the ground fault, the operator may either drain the melt bath to insure prevention of run-out, or retain the melt bath and run a risk of subsequent run-out. Premature draining of the melt bath results in excessive losses, as outlined above, while retaining the melt bath when an internal ground fault does indeed exist seriously increases the risk of run-out damage.

Third, refractory linings wear as melt batches are made. Refractory materials have defects and inconsistencies which make linings wear at different rates. As the linings wear, the refractory wall thickness decreases, occasionally resulting in a metal run-out through a weakened or thin portion of the wall. Presently, linings are visually inspected when the furnace is drained, typically only every few weeks. Because the linings typically last only from three to ten weeks, this visual inspection results in only a crude approximation of lining wear between inspections. Often, a refractory liner does not wear consistently and can become excessively thin soon after a visual inspection indicates that the liner is safe.

Fourth, when ground faults occur, the power system is tripped off quickly. Consequently, electrical instruments and meters, which might give clues to the nature of the trip problem, go dead when power is lost. This lost information is difficult, if not impossible, to recapture once the trip occurs.

Fifth, some furnaces have more than one power coil which are tied together through bus switches when a ground fault occurs. Currently, the only method for determining which coil is grounded is by isolating each coil and testing that coil with an ohm meter. This requires excessive time resulting in excessive losses, as outlined above. All previous detection systems used with cables for fault detection are not applicable to coils because of the mutual flux linkage between coil turns. Cables have distributed impedances, but coils have uneven impedances along its length.

SUMMARY OF THE INVENTION

According to the present invention these and other problems in the prior art are solved by the provision of a computerized induction furnace monitor that is capable of locating ground faults within seconds. The monitor comprises means for measuring a first voltage across the power coil and means for measuring a second voltage between an end of the coil and an electric ground. The voltage drop along the length of the coil is not truly proportional to the distance along the coil, because uneven magnetic flux concentrations causes impedance variations along the coils' length. The ratio of the first voltage to the second voltage provides only a rough indication of the location of the ground fault. An analyzer, preferably a digital computer, is provided for calculating this ratio and multiplying the length of the coil by this ratio to approximate the position of the ground fault on the coil. An impedance variation look-up table is included to provide correction factors for the approximated distance to compensate for variations in impedance along the length of the coil. Consequently, the location of the ground fault along the length of the coil can be rapidly and accurately determined within seconds of its occurrence.

In a second aspect of the invention, the location of the ground fault along the length of the coil, once determined, is graphically displayed. This method of illustrating the location of the ground fault includes displaying a representation of the grounded coil turn, displaying a representation of a yoke proximate the ground fault, and displaying a ground fault indicator in relation to the turn and yoke representations to provide a visual indication of the position of the ground fault with respect to that turn and yoke. In a preferred embodiment, the method further comprises the steps of displaying representations of all of the coil turns of the furnace and representations of one-half of the furnace yokes to provide the operator with a broader picture of the ground fault location. This graphic display makes possible the illustration of the location of the ground fault in a manner easily understandable to the furnace operator.

In a third aspect of the invention, the computerized monitor includes a detection system for determining within seconds whether an internal or external ground fault exists. Internal ground fault current, if any, flows through the ground rods and up a sensing relay which trips the power off. Current caused by recirculating currents within the melt bath also flows through the ground rods. The recirculating current passes through the bath, down the ground rods, up the steel frame of the furnace, and through a metal build-up at the rim of the furnace (called the skull), and back down into the bath. When an internal ground fault exists, both the fault current and the recirculating current flow through the ground rod. Recognizing that (1) the recirculating current is typically in phase with the coil current and (2) the internl ground fault current is typically not in phase with the coil current, the present invention detects internal ground fault current by comparing the phases of the coil current and the ground rod current. Any substantially nonzero current component measured in the ground rod when the coil current is zero is internal fault current.

A second method for determining fault inside or outside the coil is to periodically measure phase relationship between coil voltage and ground rod current and store latest measurements. The phase relation between coil voltage and ground rod current is then measured at the occurrence of a ground fault and compared to the last periodic measurement. If the phase measurement is the same, then the fault is external, otherwise, the fault is inside the coil. In this third aspect of the invention, the monitor includes means for monitoring the coil current, means for monitoring the melt bath ground current, and analyzer or computer means for comparing the phases of the coil and melt bath ground current for unacceptable differences indicating that an internal ground fault exists. Consequently, the computerized monitor can determine whether a ground fault is internal or external, greatly facilitating location of the ground fault and eliminating guess work regarding potential run-outs.

In a fourth aspect of the invention, the computerized furnace monitor monitors refractory wall thickness. Recognizing (1) that the volume of the melt bath increases as the refractory wall becomes thinner, and (2) that the resistance of the melt bath decreases with an increase in volume, the present invention monitors refractory wear by monitoring an electric component indicative of the melt bath volume. More particularly, the monitor includes means for determining the resistance of the melt bath and means for approximating the refractory wall thickness based on the resistance of the melt bath. Because the coil resistance is proportional to the bath resistance, the bath resistance determining means further comprises means for determining the voltage across the coil, means for determining the power consumed by the coil, and means for calculating the coil resistance based on the equation $R = V^2/P$. Consequently, an estimation of refractory wear may be made simply by monitoring the voltage across, and power consumed by, the furnace coil. In a preferred embodiment of this aspect of the invention, many calculations of the resistance value of the furnace are averaged over a period of time to eliminate errors in individual approximations due to the presence of impurities (e.g. slag) within the bath and varying bath levels. Also preferably, the refractory wall thickness is approximated using a look-up table containing both resistance values and refractory thickness values stored during previous resistance measurements and visual inspections of the refractory wall.

In a fifth aspect of the invention, the furnace monitor includes means for recording, prior to power termination, all meter readings existing when a ground fault is detected. Consequently, the furnace operator can, for diagnostic purposes, readily examine all instrument readings existing at the occurrence of the ground fault and immediately before power is lost.

In a sixth aspect of the invention, the computer monitor for a multi-coil furnace determines which of the coils is fault grounded. Means for monitoring the current going into and coming out of each coil is provided and is coupled to the computer so that the computer can determine the grounded coil by determining the coil in which the currents passing into and out of the coil are substantially nonequal. The grounded coil can be located within seconds.

These and other objects, advantages, and features of the invention will be more fully understood and appreciated by reference to the written specification and appended drawings.

BRIEF DESCRIPTION OF THE DRAWINGS

FIG. 1 is a sectional view of an induction furnace;

FIG. 2 is a simplified, perspective view, partially broken away, of the induction furnace illustrated in FIG. 1;

FIG. 7 is a sectional view of an unworn refractory liner;

FIG. 8 is a sectional view of a worn refractory liner;

FIG. 13 is a flowchart of the "refractory thickness" routine;

FIG. 21 is a view of the graphic representation of refractory wear generated by the present invention.

DESCRIPTION OF THE PREFERRED EMBODIMENTS

Figure 3:
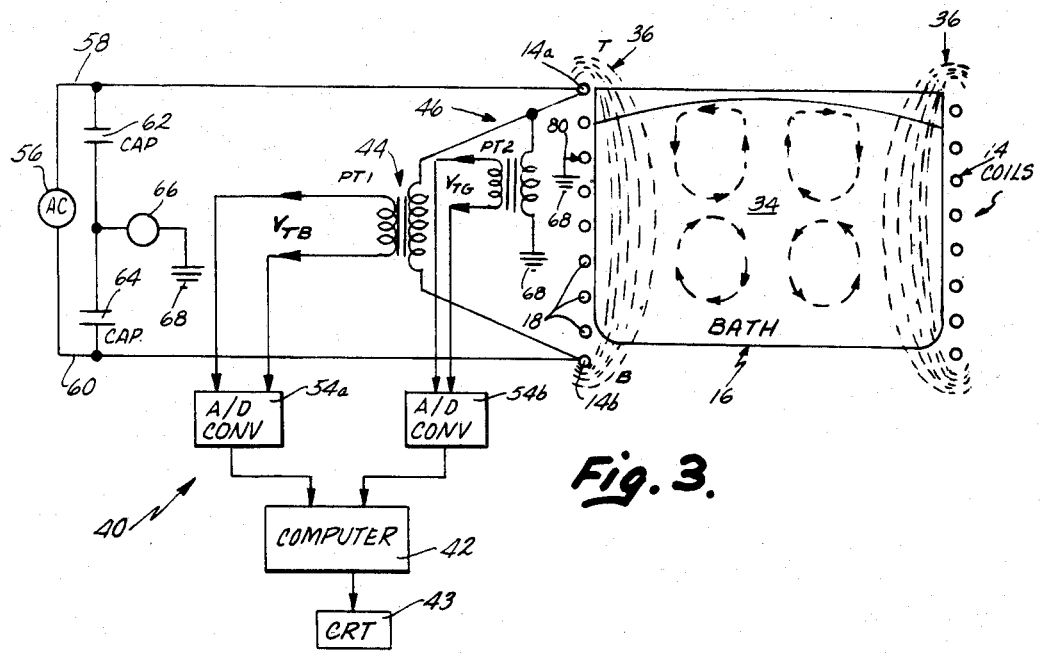
FIG. 3 is a schematic diagram showing the circuitry of the present invention for locating a ground fault along the length of the induction furnace coil.

A conventional coreless induction furnace is illustrated in FIG. 1 and generally comprises a support frame 10, yokes 12, coil 14, and refractory liner 16. Each of yokes 12 is a generally elongated member oriented vertically. A plurality of yokes 12 are oriented about the circumference of the furnace and supported on frame 10. Coil 14 is supported by yokes 12 and includes a plurality of turns 18 encircling liner 16. The cross-sectional area of the coil 14 is generally uniform throughout its length. Each of turns 18 is generally circular. The liner is made of any suitable refractory material and includes a generally cylindrical liner wall 20 which before use has a thickness which varies depending on metal material, but typically is 8 to 16 inches. A plurality of ground rods 22 extend through the bottom of the refractory liner and are electrically grounded in any well-known manner. Also included on the furnace, as is well known, are cooling coils 24, a layer 26 of fire brick, a layer 28 of insulating brick, movable lid 30, and pour spout 32. Molten metal bath 34 is contained within liner 16 and heated to a molten state by passing electric current through coil 14.

The operation of the furnace is most clearly illustrated in FIG. 2 which includes only coil 14, liner 16, and molten bath 34. After the materials to be melted have been placed within liner 16, an intense alternating electric current is applied to coil 14, which induces magnetic flux 36 which pass through the molten bath 34. Magnetic flux 36 also passes through and is reinforced by yokes 12 (see FIG. 1) which direct the magnetic field through bath 34. Magnetic field 36 induces eddy currents 38, generally transverse to magnetic flux 36, which through resistance heating reduce the material within liner 16 to a molten state. Occasionally, new materials are added to bath 34 and molten metal is drawn from the bath, with typically no more than one sixth of the bath exchanged at any one time.

Coil 14 is powered by an alternating power source 56 (FIGS. 3 and 4) electrically connected to the coil through lines 58 and 60. A conventional ground fault sensing and tripping device includes capacitors 62 and 64, connected in series between lines 58 and 60, and a relay 66, connected at one terminal between capacitors 62 and 64 and at the other terminal to ground 68.

Figure 4:
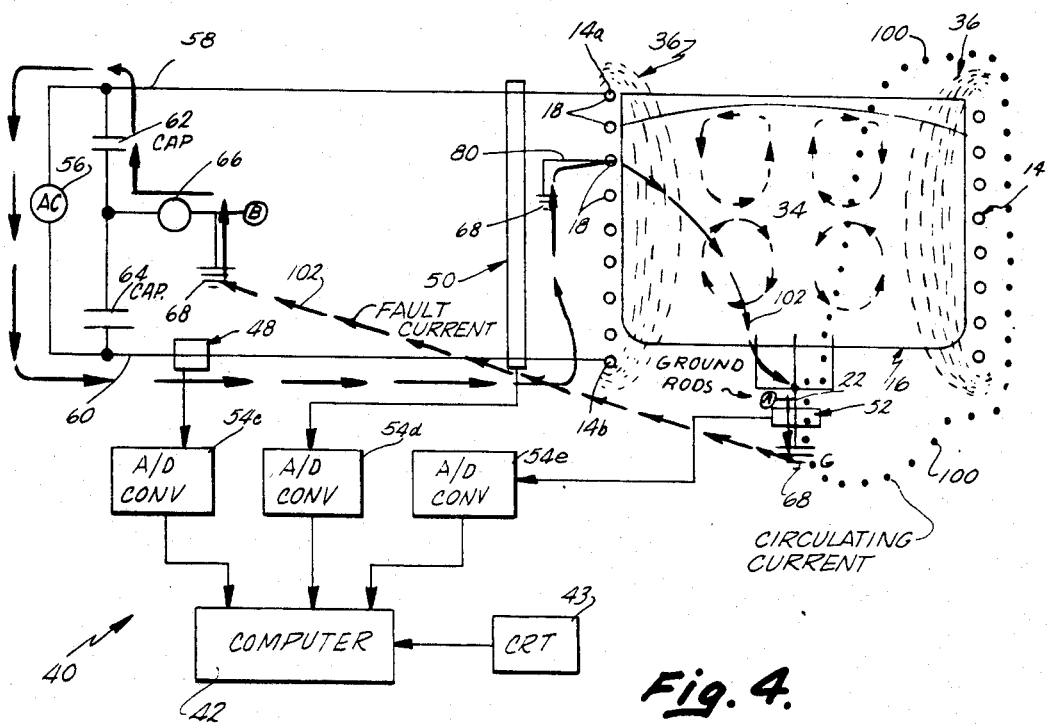
FIG. 4 is a schematic diagram showing the circuitry of the present invention for determining whether a detected ground fault is internal or external.

An induction furnace monitor constructed according to the present invention is illustrated in FIGS. 3 and 4 and generally designated 40. Generally, monitor 40 comprises computer 42, the operation of which is detailed in FIGS. 9–18, CRT 43, potential transformers 44 and 46 (FIG. 3), current transformers 48, 50 and 52 (FIG. 4), and a plurality of analog-to-digital converters 54.

Turning more specifically to the construction of monitor 40, potential transformers 44 and 46, differential current transformers 48, 50 and 52, analog-to-digital converters 54, and computer 42 are all conventional components commercially available to those having skill in the art. As illustrated in FIG. 3, transformer 44 is electrically connected across the entire length of coil 14 between top and bottom coil ends 14a and 14b to provide an analog signal representative of the voltage potential across the coil to converter 54a. Transformer 46 is electrically connected between the top end 14a of coil 14 and ground 68. Consequently, transformer 46 supplies an analog signal to converter 54b representative of the voltage between top end 14a and ground 68. Converters 54a and 54b convert the analog signals received from transformers 44 and 46, respectively, to digital signals usable by computer 42.

Current transformers 48 and 52 are connected to line 60 and ground rods 22, respectively, to detect the current flowing therethrough. Transformers 48 and 52 deliver an analog signal to converters 54c and 54e, respectively, representative of the currents through line 60 and grounds rods 22, respectively. Additionally, differential current transformer 50 is connected to both lines 58 and 60 to provide an indication of the difference between the currents in these lines and to povide an analog signal to converter 54d. All of converters 54c, 54d and 54e convert the analog signals to digital signals usable by computer 42.

Figure 6:
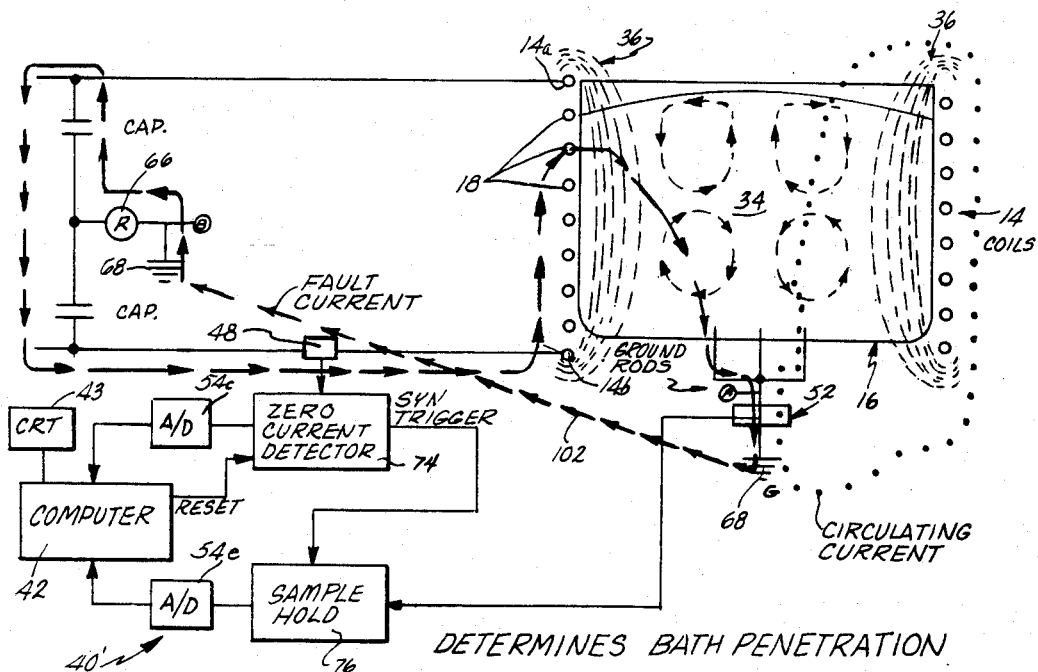
FIG. 6 is a schematic diagram showing an alternative circuit for determining whether a detected ground fault is internal or external.
Figure 5:
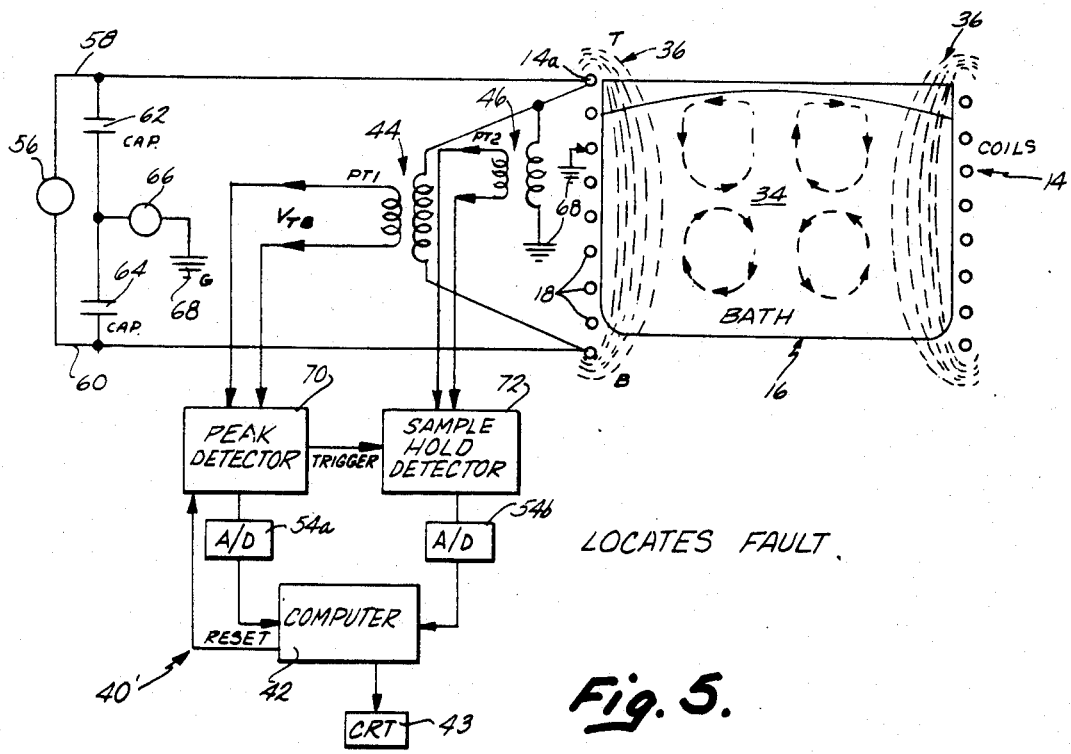
FIG. 5 is a schematic diagram showing an alternative circuit for determining the location of the ground fault along the length of the coil.

An alternative monitor 40' is illustrated in FIGS. 5 and 6. All components in FIGS. 3–6 which are numbered identically are identical. The only difference between FIGS. 3 and 5 is that peak detector 70 and sample-hold detector 72 are added. The only difference between FIGS. 4 and 6 is that zero-current detector 74 and sample-hold detector 76 are added. Additionally, differential current transformer 50 and converter 54d have been eliminated from FIG. 6 for illustration only. Peak detector 70, sample-hold detector 72, zero-current detector 74 and sample-hold detector 76 are all conventional elements commercially available to those having ordinary skill in the art. Peak detector 70 is connected to transformer 44 and issues trigger signals to both sample-hold detector 72 and computer 42 when the voltage sensed by transformer 44 is a maximum. The peak detector 70 stores (freezes) the peak analog signal until reset by computer 42. Sample-hold detector 72, when triggered by peak detector 70, stores the analog signal produced by transformer 46. Somewhat similarly, zero current detector 74 is coupled to current transformer 48 and issues a trigger signal to both computer 42 and sample-hold detctor 76 when a zero current situation is detected. The computer 42 resets the zero current detector 74 after receiving reading from sample hold unit 76. When triggered by detector 74, sample-hold detector 76 stores the analog signal received from current transformer 52. These analog signals are converted by 54c and 54e A/D units and used by computer 42.

FIGS. 7 and 8 illustrate refractory liners 6 having unworn and worn liner walls 20, respectively. As seen in FIG. 7, an unworn liner wall 20 is relatively thick, having in one environment of the invention a beginning thickness in one environment of approximately 16 inches. FIG. 8 illustrates the appearance of the liner wall 20 after extensive use. Run-out is much more likely to occur when liner wall 20 is thin, as in FIG. 8. When bath level 78 is consistently maintained during furnace use, the volume of bath 34 increases as liner wall 20 is worn away. Using well known geometric equations, the average thickness of liner wall 20 may be determined when the volume of melt bath 34 is known.

OPERATION

Figure 19:
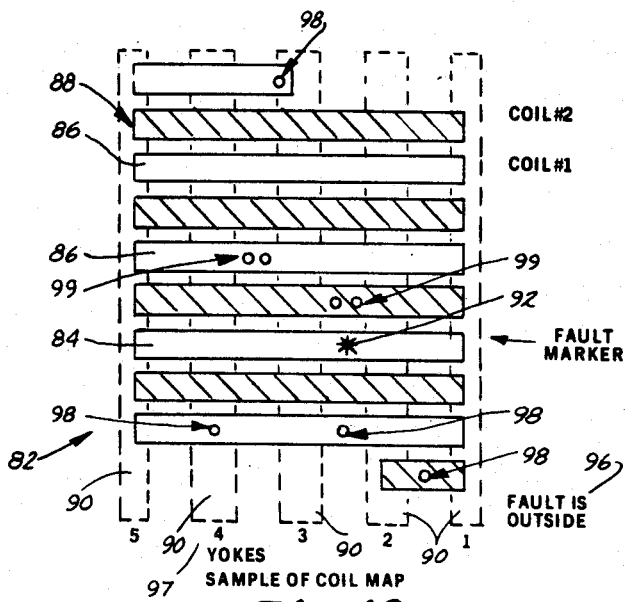
FIG. 19 is a view of the graphical representation of the location of the ground fault generated by the present invention.
Figure 20:
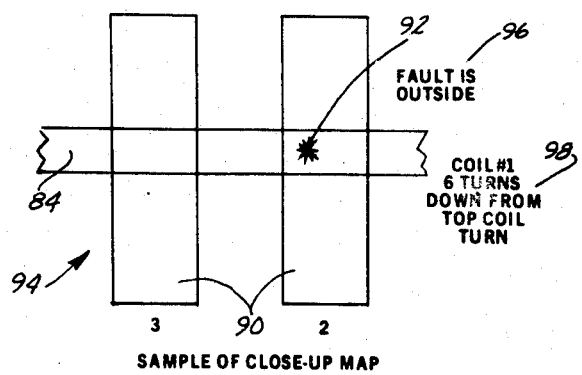
FIG. 20 is a view of the close-up, or zoom, graphical representation of the location of the ground fault.

Monitor 40 detects the occurrence of ground fault 80, determines the position along the length of coil 14 at which the ground fault is located, determines whether the ground fault is internal or external, and generates a graphical representation (FIGS. 19 and 20) of the location of the ground fault. FIG. 19 illustrates a graphical representation drawn on CRT 43 by computer 42 wherein display 82 includes a representation 84 of the coil turn on which ground fault 80 is located. Other representations 86 are included for other turns of the coil. A second coil when present on the furnace is represented as 88. Representations 90 of yokes proximate the ground faulted area are included to provide further reference for the location of the ground fault. Ground fault indicator 92 is superimposed on grounded coil 84 and in proper relation to yokes 90 to indicate the position of ground fault 80 within the furnace. Further reference points are provided by the illustration of power terminals 98 and water connections 99. Yokes are numbered as at 97 to provide correspondence between the display and the furnace. Optionally, the operator may select close-up or zoom representation 94, illustrated in FIG. 20, to obtain a more precise indication of the location of the ground fault. Representation 94 includes only representation 84 of the grounded coil turn, representations 90 of the two yokes closest ground fault 80, and ground fault indicator 92. Indication 96 states whether the fault is internal or external, and legend 98 indicates which is the faulted coil (#1 or #2) and its position in turns from the top of the power coil.

During normal furnace operation, recirculating current 100 is induced within bath 34 (FIG. 4) and flows through bath 34, ground rods 22, ground 68 (the furnace frame), and back into bath 34 through a metal build-up on the rim of liner 16. This recirculating current is in phase with the current in coil 14. When a ground fault 80 occurs, ground fault current 102 flows through bath 34, ground rods 22, ground 68, relay 66, one of capacitors 62, power source 56, and coil 14, back into bath 34. Because ground fault current 102 flows through one of capacitors 62 and 64, this current is out of phase with the coil current.

The position along the length of coil 14 at which ground fault 80 is located is determined by computer 42 in comparing the voltage potentials measured by transformers 44 and 46. Because the voltage drop along the length of the coil is nearly proportional to the distance along the coil, the ratio of $V_{TG}$ to $V_{TB}$ provides a rough approximation, or indication, of the percentage of the total coil length between top coil end 14a and ground fault 80. By multiplying this ratio by the length of the coil, the distance between top coil end 14a and ground fault 80 is roughly approximated. Additionally, because the impedance along the coil is not uniform, computer 42 further comprises a look-up table for correcting the computed ratios and/or distances based on previously determined variations in the coil impedance. The process of determining the coil impedance variations is called "coil mapping." To insure accurate fault location determination, each coil may be "mapping" with its particular variations recorded in the computer look-up table. Once the distance between top coil end 14a and the gorund fault 80 is determined, computer 42 can accurately determine the position of ground fault 80 with relation to yokes 12 for graphic display.

Additionally, through current transformers 48 and 52, computer 42 monitors the phase difference in the coil and melt bath ground currents to determine whether fault 80 is internal or external. In the absence of an internal ground fault, these two currents are typically in phase, i.e., the melt bath ground current is zero when and only when the coil current is zero. However, when computer 42 detects that the coil current is substantially nonzero when the melt bath ground current is zero, or vice versa, the computer determines that an internal ground fault exists. When ground fault 80 is detected, coincidence of the coil and melt bath ground indicates that the ground is external, while substantial noncoincidence of these currents indicates that the ground is internal. This information is displayed on CRT 43 as legend 96. A second method of determining if fault 80 is internal or external is by measuring phase difference between applied coil voltage 44 and ground rod current 52 during normal operation. When a fault occurs the phase difference between voltage 44 and current 52 are measured and compared to normal value determined previously. If the fault phase difference is the same as the normal phase difference, then the fault is external. Otherwise, the fault is internal.

Figure 9:
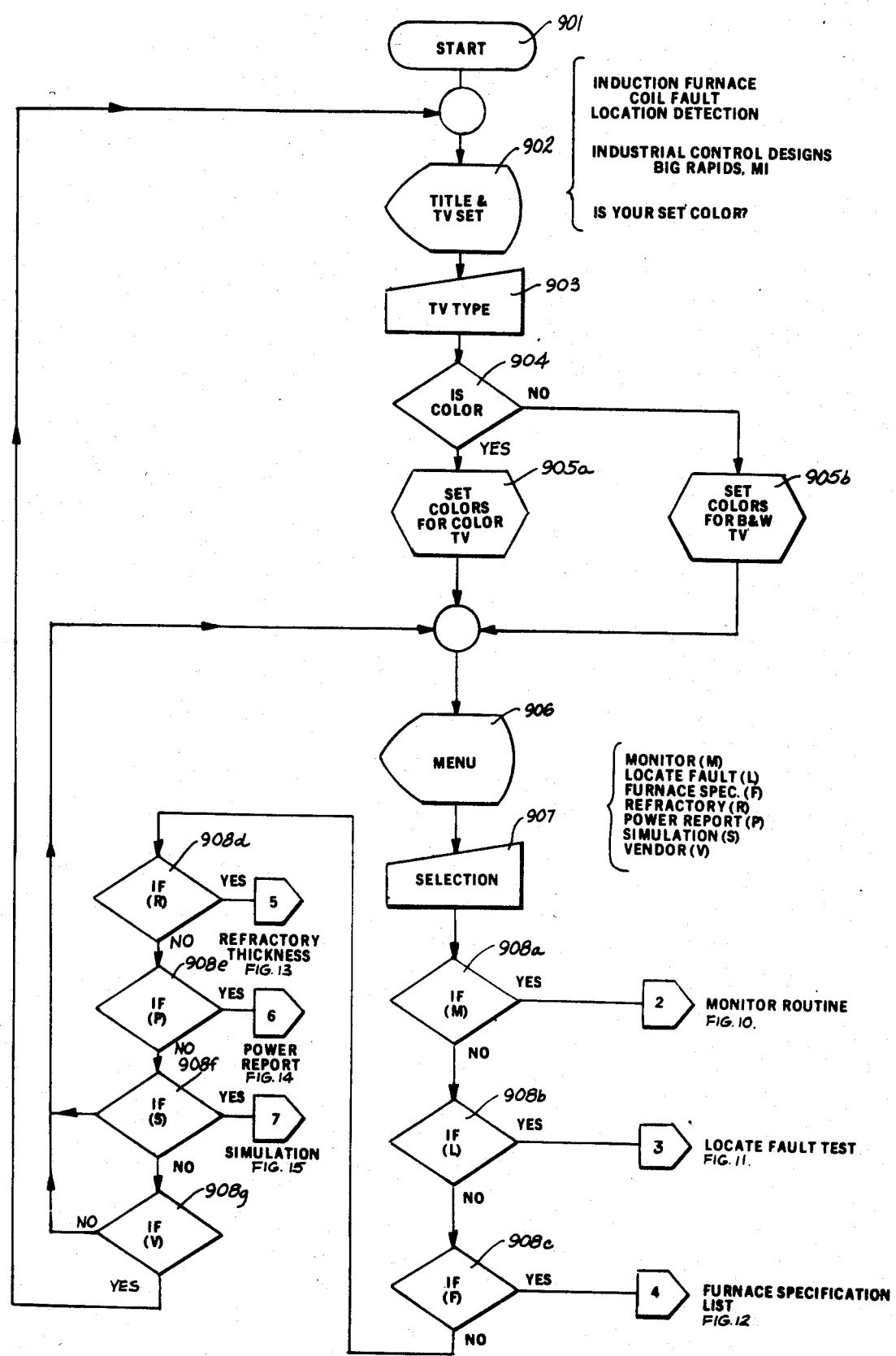
FIG. 9 is a flowchart of the "main control" of the computerized induction furnace monitor.

Turning to the operation of monitor 40 in detail, the overall program control is flowcharted in FIG. 9. When the computer 42 is started 901, the computer generates 902 a title page on CRT 43 including a request to the operator to enter the TV type. In response, the operator enters 903 the TV type, which response is analyzed 904 by the computer and the program is adjusted 905a or 905b to adapt the display to a color or black and white TV as appropriate. A menu is then displayed 906 on CRT 43 as follows:

| | |
|---|---|
| M | Monitor |
| L | Locate Fault |
| F | Furnace Specification |
| R | Refractory |
| P | Power Report |
| S | Simulation |
| V | Vendor |

In response, the operator enters 907 his selection and the main program control branches 908 to the appropriate routine, depending upon the menu selection. If an improper selection has been made 908g, the menu is regenerated 906. If the computer determines 908g that the vendor selection has been made, the title page is regenerated 902.

Figure 10:
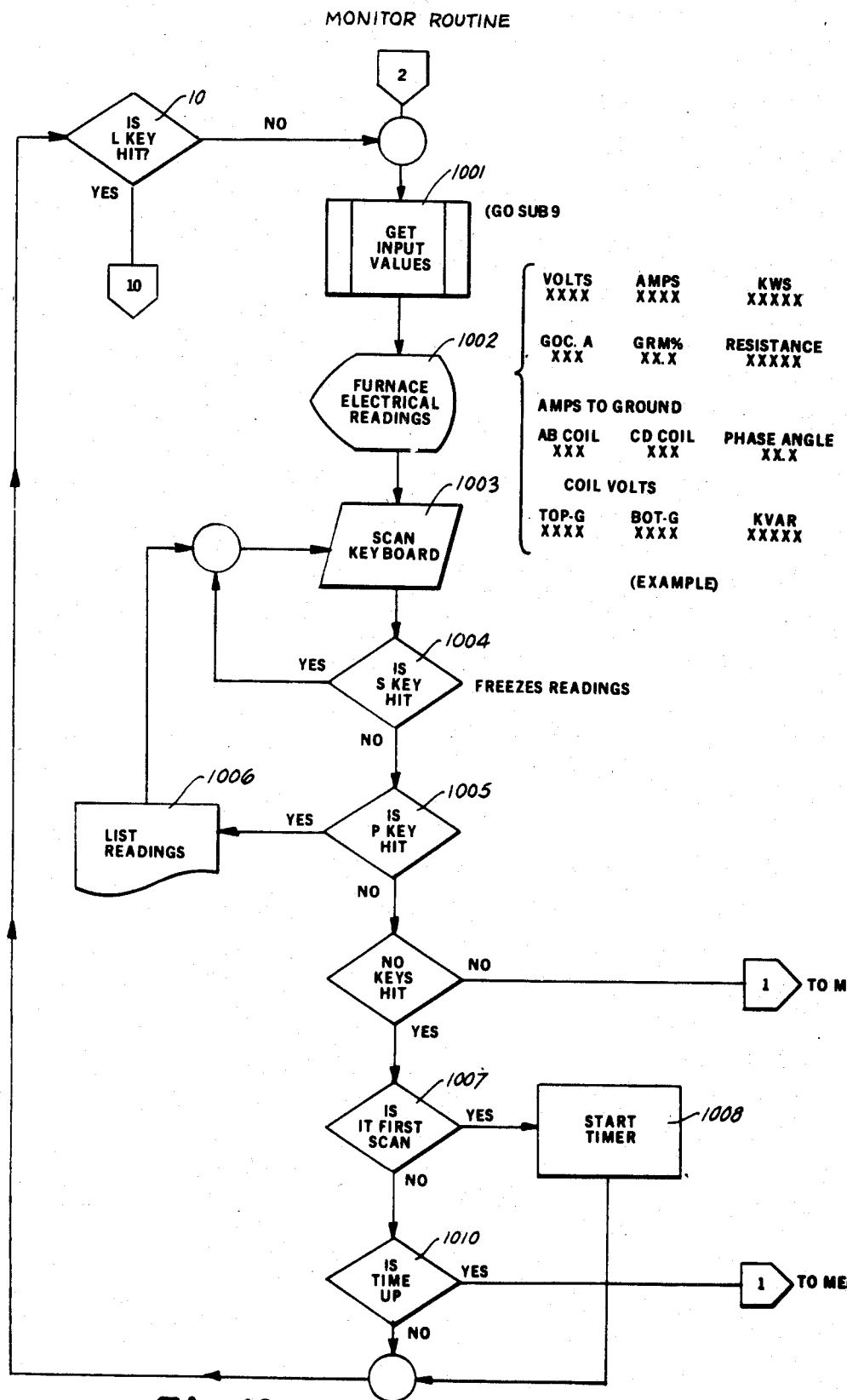
FIG. 10 is a flowchart of the "monitor" routine.

FIG. 10 is a flowchart detailing the operation of the "monitor" subroutine, which is selected when the operator desires to monitor on the CRT the various electrical measurements relating to the furnace. When entered, the routine first obtains 1001 all electrical measurements relating to the furnace, including coil voltage, coil amps, kilowatts of real power, ground overcurrent amps, phase angle of coil current, the ground resistance monitor percentage, relative power, coil voltage top-to-ground, coil voltage bottom-to-ground. From these readings, the phase difference between the coil current and the melt bath ground current, and the resistance of the coil fault path are circulate. All of these values are then displayed 1002 on the CRT. Computer 42 then scans 1003 the keyboard to determine which, if any, keys have been struck by the operator. If the computer determines 1004 that the "S" key has been struck, an interruptable loop is entered wherein the keyboard is scanned 1003 until a key other than the "S" key is struck. This loop effectively freezes the readings displayed on CRT 43. If the computer determines 1005 that the "P" key has been struck, the values currently displayed on CRT 43 are printed 1006 on a printer (not shown) and the computer again scans keyboard 1003. If any other key other than "S" or "P" has been struck, control returns to block 906 in FIG. 9 wherein the menu is redisplayed. If no key has been struck and this is the first pass through the monitor routine 1007, a timer is started 1008 and control passes to block 1009. If the "L" key is hit then the last coil fault picture is displayed by jumping to fault display routine. On subsequent passes through the routine, the computer determines 1010 whether the time has expired. If time has expired, control returns to block 906 in FIG. 9 wherein the menu is displayed; if time has not expired, control again returns to block 1009.

Figure 11:
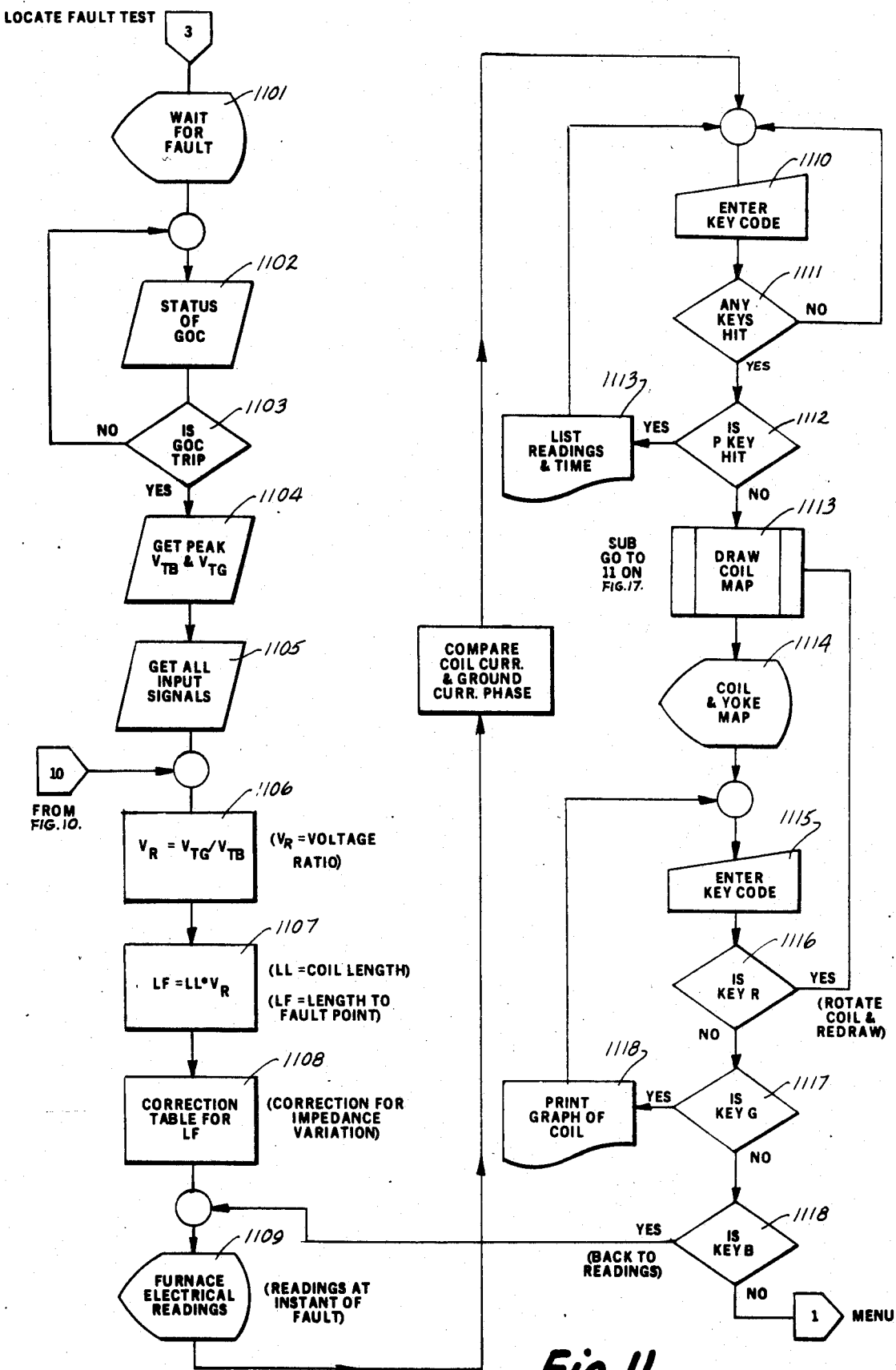
FIG. 11 is a flowchart of the "locate fault" routine.

The "locate fault" routine is flowcharted in FIG. 11. Upon entering the subroutine, the message "WAIT FOR FAULT" is displayed 1101 on CRT 43. The computer then queries 1102 the status of ground overcurrent amperes (GOC) and determines 1103 whether the power has been tripped. If the power has not been tripped, an interruptable loop is entered wherein the status of the GOC is continually queried until a trip is detected. When the computer determines that the power source is about to be tripped, the computer obtains 1104 both the voltage from coil top to coil bottom ($V_{TB}$) and the voltage from coil top to coil fault point ($V_{TG}$). The computer also obtains 1105 values of all electrical measurements relating to the furnace, as described in conjunction with block 1001, for subsequent display. The voltage ratio ($V_R$) is calculated 1106 as the quotient of $V_{TG}$ divided by $V_{TB}$. The length (LF) along the coil from the first test point to the ground fault is then calculated 1107 as the product of the total length (LL) of the coil and $V_R$. A correction, or look-up table is then consulted 1108 to provide a predetermined correction factor to LF based on variations in the impedance of the coil along the length of the coil. The look-up table is generated prior to furnace operation by using a probe to selectively ground coil 14 at a plurality of locations to establish the variations in impedance along the length of the coil (referred to as "coil mapping"). The readings captured at 1105 are then displayed 1109 on CRT 43 and the operator is instructed 1110 to enter a key code. When a key has been struck 1111, if the key is the "P" key 1112, the readings displayed on CRT 43 are printed 1113 and a new key code is requested 1110. If any key other than the "P" key has been struck (1109A), coil current phase is checked with ground rod current phase to determine inside/outside fault location. Next the coil map is generated 1113 as detailed in FIG. 17, and the coil map is displayed 1114 on the CRT. A key code is then again requested 1115 from the operator. If the "R" key is struck 1116, the coil map is rotated and redrawn 1113. By rotating, the operator has the option of selecting those contiguous yokes to be displayed on the CRT in conjunction with the ground fault indicator. Initially, the yoke nearest the groud fault as well as one-half of the yokes closest the reference yoke are drawn. Subsequently, the operator may "rotate" the initial graph which shifts yokes off one side of the representation and introduces new yokes on the opposite side. Accordingly, the operator may obtain a full "view" of the furnace from virtually any yoke angle of the furnace. If the "G" key has been struck, a graph of the coil is printed 1118 and a new key code is requested 1115. If the "B" key is struck 1118, the measurement readings obtained at 1105 are redisplayed 1109 on the CRT. If any other key is struck, control returns to 906 in FIG. 9.

Figure 12:
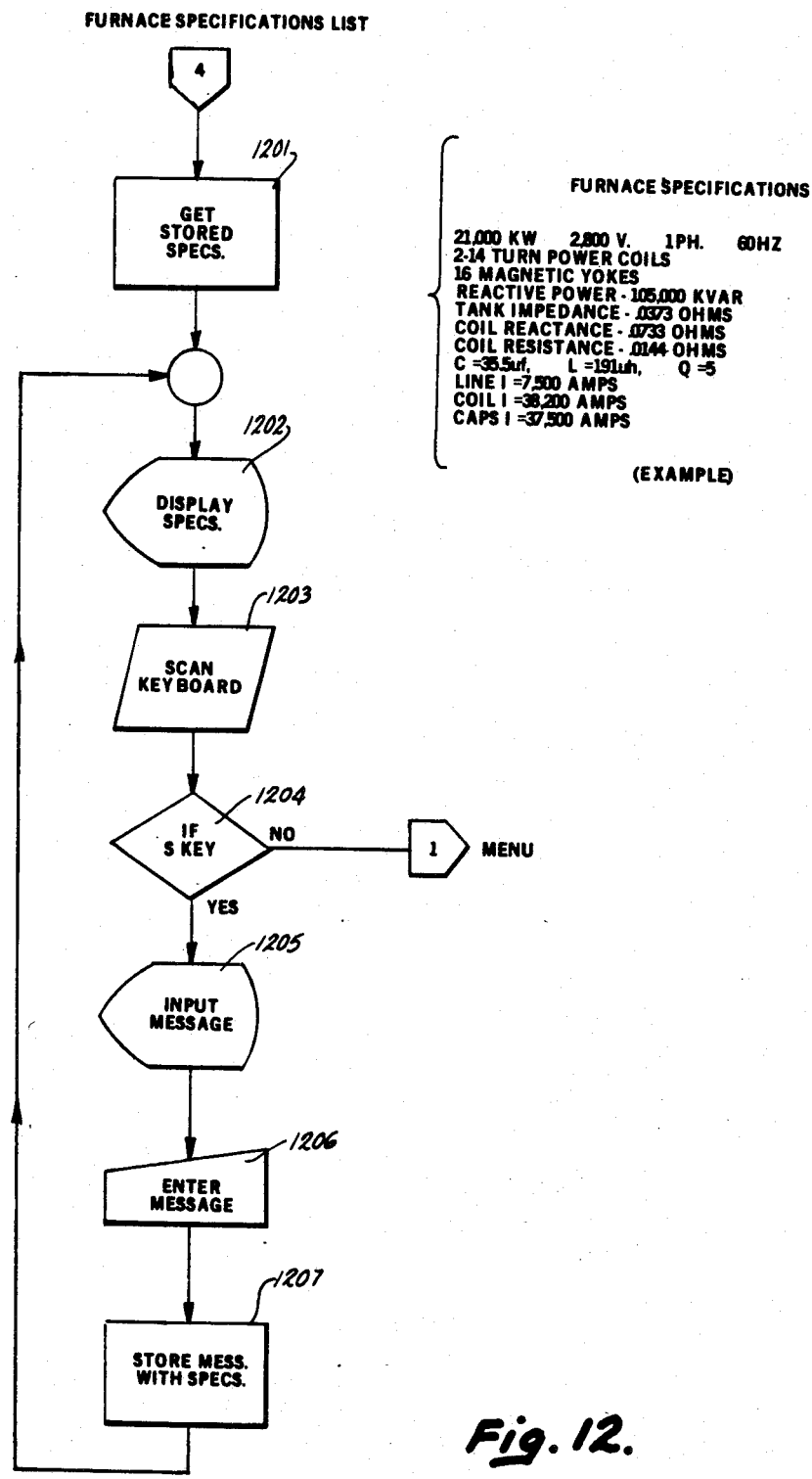
FIG. 12 is a flowchart of the "furnace specifications" routine.

The flowchart of the "furnace specification" subroutine is detailed in FIG. 12. When entered, all of the various furnace specifications for a particular furnace type are recalled 1201. These specifications include rated power consumption, rated coil voltage, number of phases, current frequency, number of coils and turns, number of magnetic yokes, maximum reactive power, tank impedance, coil resistance, coil reactance, line current, coil current, coil inductance (L), capacitor capacitance (C), Q factor of tuned circuit, and total current to capacitors. This information is then displayed 1202 on the CRT and the keyboard is scanned 1203. If the "S" key is struck 1204, the instruction "INPUT MESSAGE" is displayed 1205 on the CRT and the computer waits 1206 for operator input, which is then stored 1207 for subsequent display 1202 with the other furnace specifications. If a key other than "S" is struck 1204, control returns to 906 in FIG. 9, wherein the menu is redisplayed.

The flowchart of the "refractory thickness" subroutine is illustrated in detail in FIG. 13. The computer first retrieves 1301 thickness data generated by other portions of the computer program. This data is then graphed 1302 onto CRT 43, and the computer waits 1303 for a key entry. The graph appears as a Cartesian plot with "TONS MELTED" appearing along the X-axis, the "REFRACTORY THICKNESS" appearing along the Y-axis. A linear "ideal wear" line 2103 is plotted illustrating ideal wear characteristics of the thickness of the refractory wall 20. The actual refractory thicknesses are plotted as line 2104 which typically will not be linear. The operator can readily view a history of the thickness of the refractory liner to determine when the liner is wearing excessively as indicated at 2105 wherein the furnace is in danger of a run-out. Alternatively, time or other variables could be used as the independent variable along the X-axis instead of "TONS MELTED." After a key entry is made 1303, the computer prints 1304 the graph illustrated on the CRT if the "P" key is depressed 1305. If the "Z" key is depressed 1306, all thickness data is zeroed out 1307, indicating to the computer that the refractory liner has been replaced and is unworn. If any key other than "P"

or "Z" is depressed, the computer receives 1308 the most recently calculated thickness for the liner wall and displays 1309 this thickness on the CRT. The computer again waits 1310 for a key code. If the "P" key is depressed 1311, the last thickness calculation displayed on the CRT is printed 1312 on the printer. If the "S" key is depressed 1313, the operator may enter 1314 a message which is stored 1315 with the thickness data for subsequent retrieval 1301 and display 1302. If any key other than "P" or "S" is depressed 1313, control returns to 906 in FIG. 9 wherein the menu is redisplayed.

Figure 14:
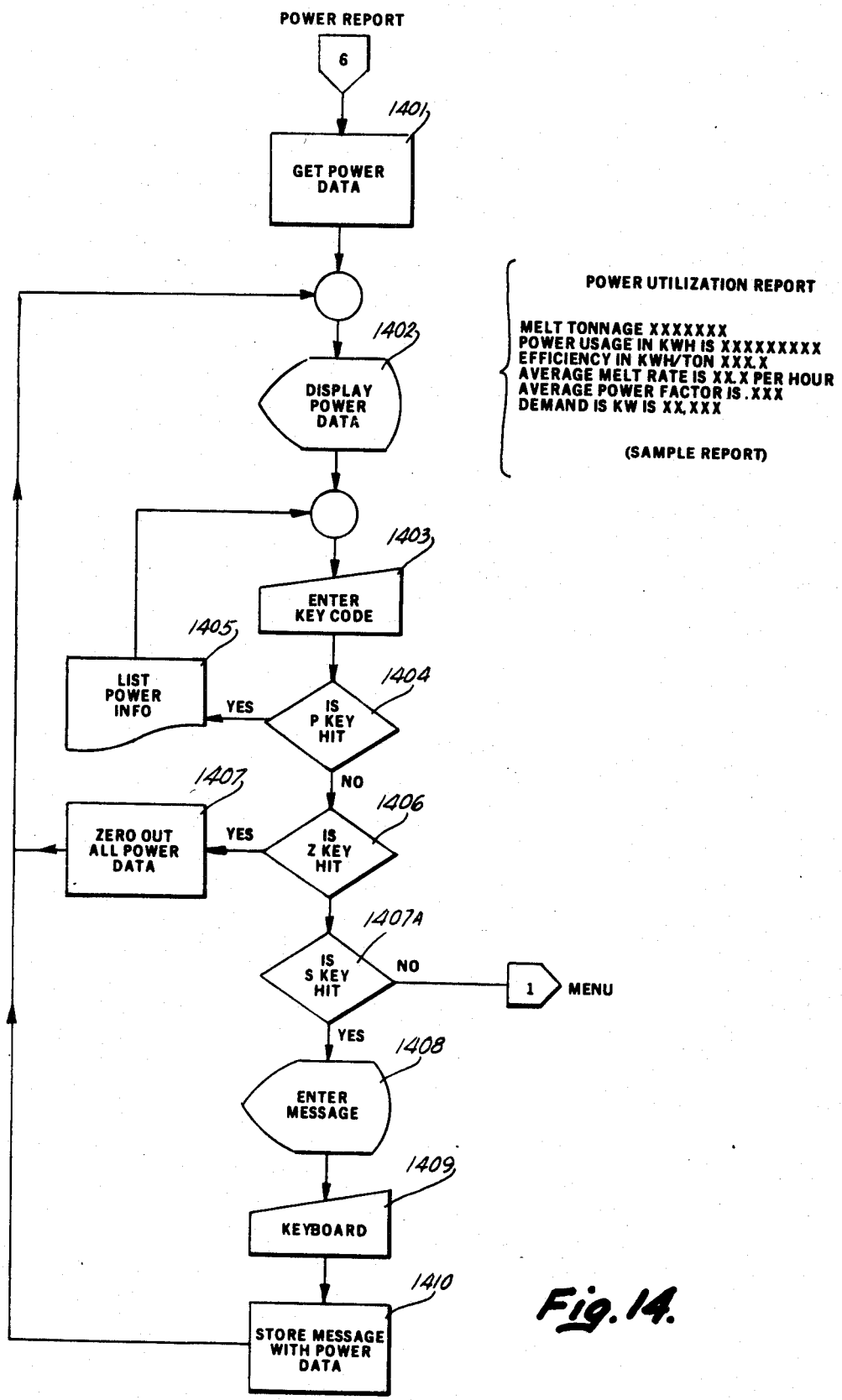
FIG. 14 is a flowchart of the "power report" routine.
Figure 15:
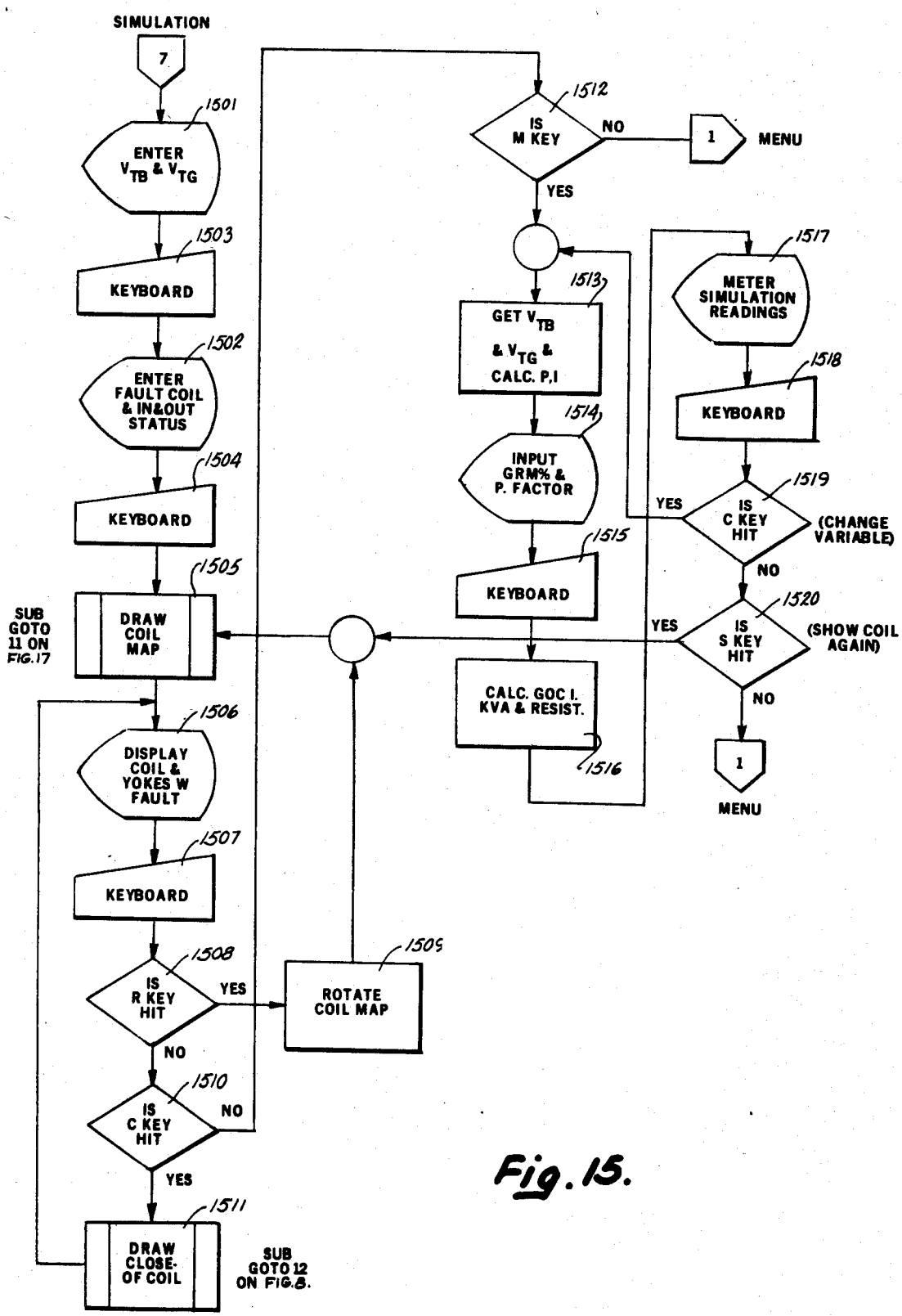
FIG. 15 is a flowchart of the "simulation" routine.

The flowchart of the "power report" subroutine is illustrated in detail in FIG. 14. Upon entry of the subroutine, the power data calculated in other portions of the program is retrieved 1401 and displayed 1402 on the CRT. Typical power data includes cumulative melt tonnage, cumulative power usage, efficiency (KWH per ton), average melt rate, average power factor, and current peak power demand. The computer then waits 1403 for a key code, and if the "P" key is struck 1404, the power data is printed 1405 on the printer. If the "Z" key is struck 1406, all power data is zeroed out 1407 indicating to the computer that new power statistics are to be accumulated. If the "S" key is struck 1407A, the computer then displays 1408 the instruction "ENTER MESSAGE" and waits 1409 for message entry. After the message has been entered, the message is stored 1410 with the power data for subsequent retrieval 1401 and display 1402. If any key other than "P," "Z," or "S" is struck 1407A, control returns to 906 in FIG. 9 wherein the menu is redisplayed.

Computer 42 is also programmed to provide a "simulation" subroutine (FIG. 15), wherein ground faults may be simulated for learning purposes. In response to prompts 1501 and 1502, the operator or user enters the $V_{TB}$, $V_{TG}$, faulted coil identifier, and the in or out status of the fault. A coil map is then drawn 1505 by calling the subroutine shown in FIG. 17. This coil map is then displayed 1506, and the computer waits 1507 for an entry on the keyboard. If the "R" key struck 1508, the coil map is rotated 1509 as described above and redrawn 1505 and redisplayed 1506. If the "C" key is struck 1510, a closeup of the faulted area is drawn 1511 as described in FIG. 18 and redisplayed 1506. If the "M" key is struck 1512, control returns to block 906 in FIG. 9, wherein the menu is redisplayed. If any other key is struck, the computer calculates 1513 real power (P) in KW and coil amps (I) based on simulation variables. The operator is then instructed 1514 to enter ground resistance monitor percentage (GRM %) and average power factor ($PF_{AV}$). Based upon the operator's entries 1515, ground over current amps (GOC), kilovolt amps of apparent power (KVA), and fault path resistance (R) are determined 1516. A simulated display of meter readings is then displayed 1517 identical to that described above in conjunction with display 1002 of FIG. 10. The computer then waits 1518 for a keyboard entry, and if the "C" key is struck 1519, control branches to 1513 where new values are inputted to change the simulated fault conditions. If the "S" key is struck 1520, control passes to 1505 wherein the coil map is redrawn and displayed 1506 showing the location of the simulated ground fault with the new parameters. If neither the "C" key nor the "S" key is struck, control returns to 906 in FIG. 9, wherein the menu is redisplayed on CRT 43.

Figure 16A:
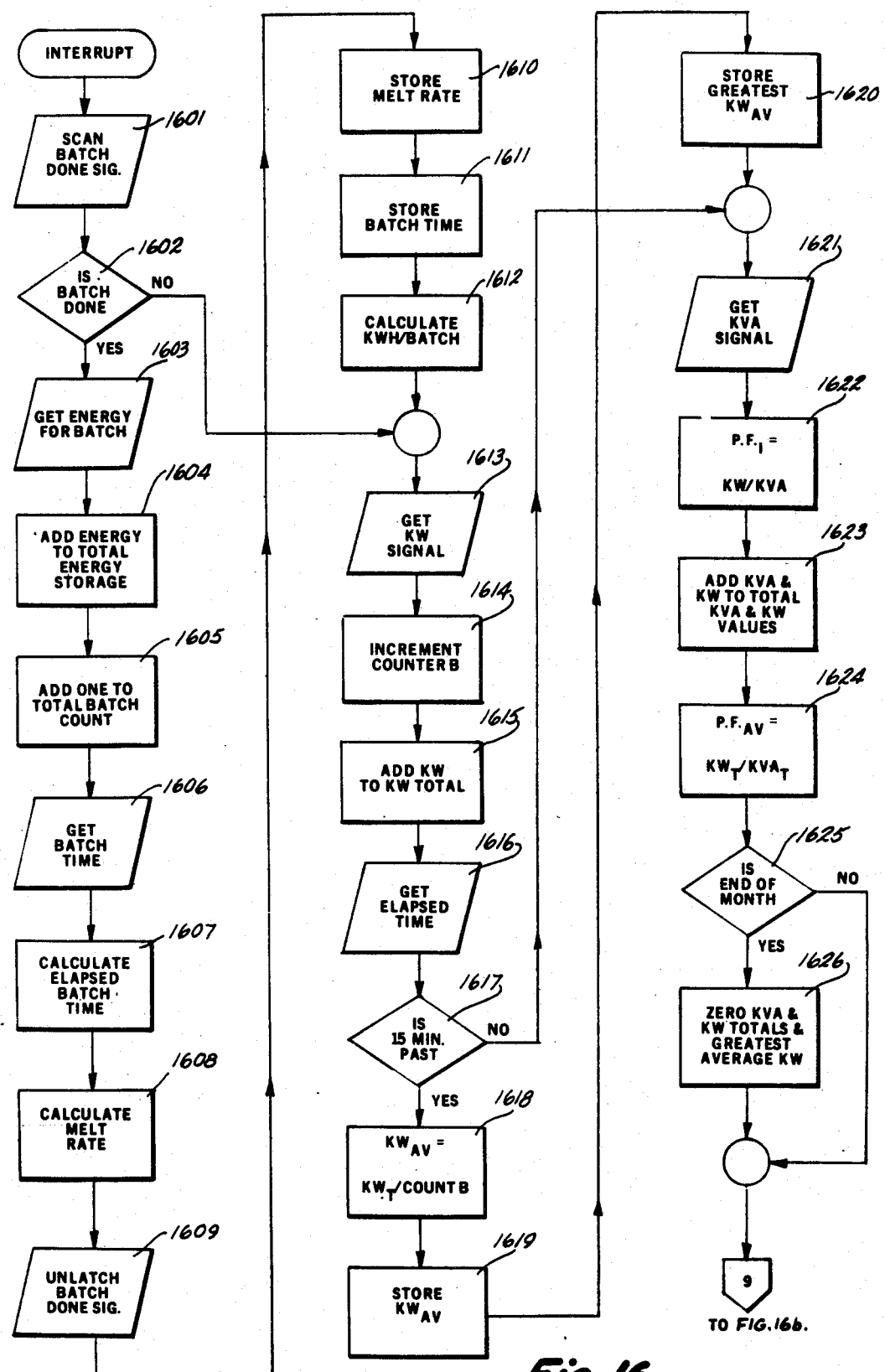
FIGS. 16a and 16b are flowcharts of the "interrupt" routine.
Figure 16B:
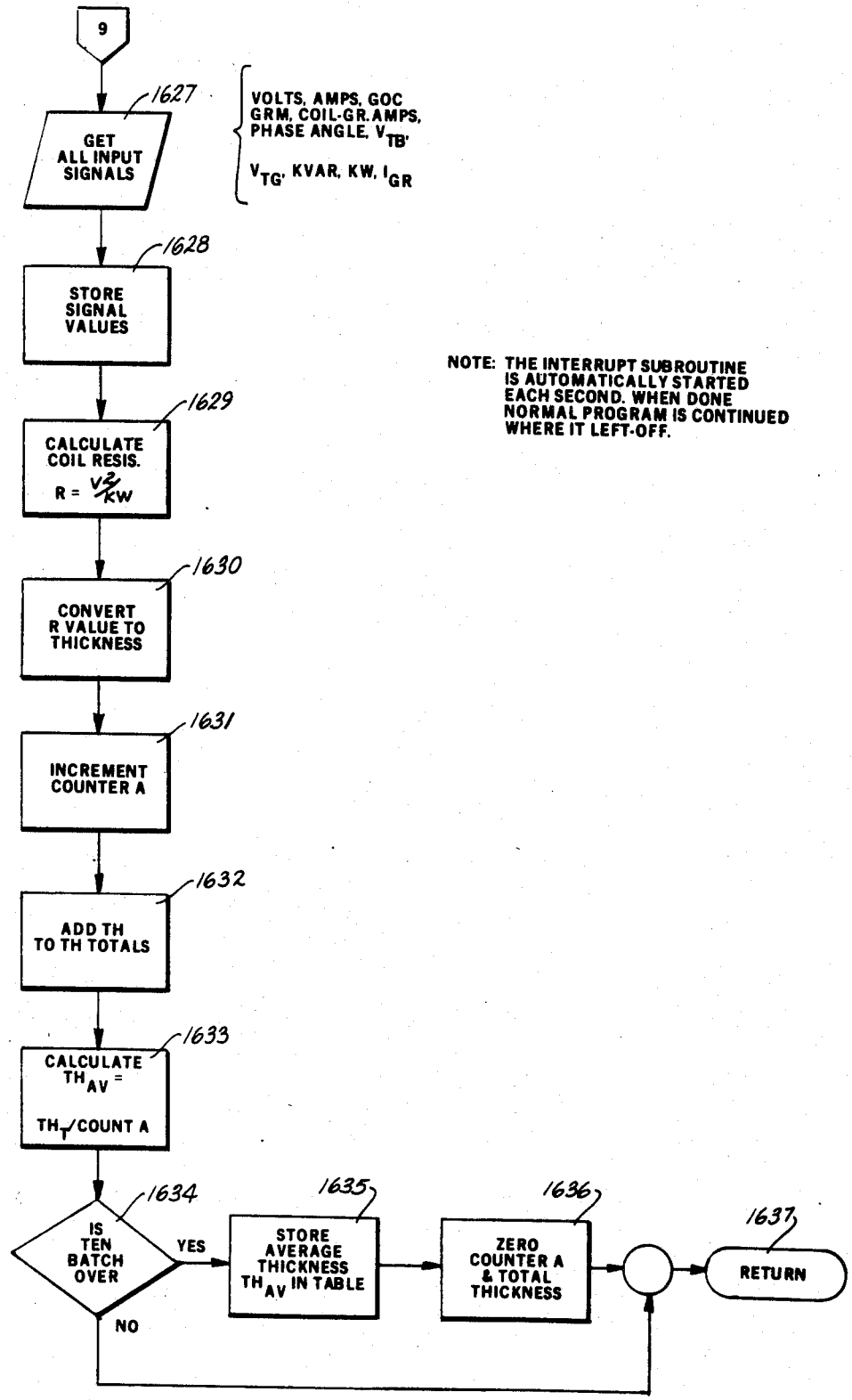

The operation of the "interrupt" subroutine is detailed in FIGS. 16a and 16b. This subroutine is automatically initiated once every second by an internal clock within computer 42. When the subroutine is entered, other processing is interrupted and resumed when the interrupt subroutine is terminated. Upon initiation, the "batch done" signal is scanned 1601 to determine whether a batch has been terminated since the last execution of the interrupt subroutine. If a batch has been completed 1602, the computer gets batch energy consumed for the batch (i.e., the energy consumed since the termination of the last batch), and adds 1604 BATCH ENERGY to TOTAL ENERGY. BATCH COUNT is incremented 1605 and the real time is read 1606. ELAPSED BATCH TIME is calculated 1607, and MELT RATE is calculated as the quotient of tons divided by ELAPSED BATCH TIME. The computer then unlatches the BATCH DONE signal and stores 1610 MELT RATE and stores 1611 BATCH TIME. Then, average energy consumption for all batches is calculated 1612 as TOTAL ENERGY divided by TOTAL BATCH COUNT. The computer then updates the average real power ($KW_{AV}$) by reading 1613 the kilowatt (KW) signal and incrementing 1614 COUNT B. KW is then added 1615 to KW TOTAL and the elapsed time is read 1616. If the elapsed time is less than 15 minutes 1617, control passes to block 1621. If the elapsed time is 15 minutes or greater, $KW_{AV}$ is calculated 1618 as total accumulated real power ($KW_T$) divided by COUNT B and stored 1619. The greatest $KW_{AV}$ is stored 1620. KVA is then read and instaneous power factor (P.F.I.) is calculated 1622 as the quotient of KW divided by KVA. $KVA_T$ and $KW_T$ are then updated by adding KVA and KW to their respective values, and average power factor ($PF_{AV}$) is calculated 1624 as the quotient of $KW_T$ divided by $KVA_T$. If it is the end of the month 1625, $KVA_T$, $KW_T$, and greatest $KW_{AV}$ are zeroed to clear these values for calculation of the next month's totals. All input signals are then read 1627 and stored 1628. These signals include but are not limited to coil voltage, coil amps, ground overcurrent amps, ground resistance monitor percentage, coil to ground amps, phase angle of the coil current, phase angle of the melt bath ground current, voltage from coil top to coil bottom, voltage from coil top to ground fault, reactive power, and current power consumption. The coil resistance is then calculated 1629 as the quotient of KW divided by $V^2_{TB}$. This resistance is then adjusted 1630 by a factor in a conversion, or look-up table, to derive an estimated linear wall thickness. This look-up table is developed during past dumps of the furnace wherein the wall thickness may be visually inspected. COUNT A is then incremented 1631, and the recently determined thickness (TH) is added 1632 to $TH_T$, the thickness total. Average thickness ($TH_{AV}$) is then calculated 1633 to be $TH_T$ divided by counter A. At the termination of each batch 1634, $TH_{AV}$ is stored 1635 in the average thickness table and both COUNT A and $TH_{AV}$ are stored 1636. The average thickness table is used in plotting the graph previously described in conjunction with the description of FIG. 21. Upon termination 1637 of the interrupt subroutine, control passes to the previously interrupted instruction.

Figure 17:
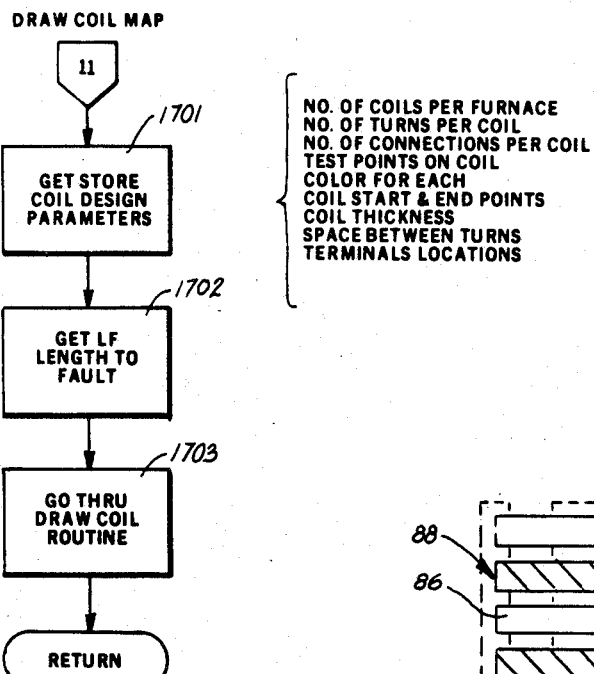
FIG. 17 is a flowchart of the "draw coil map" routine.

The "draw coil" subroutine is set forth in FIG. 17. The computer first retrieves 1701 the various coil design parameters including but not limited to:
  number of coils
  number of turns per coil
  number of connections per coil
  test points per coil
  color for each coil coil start and end points
coil thickness
space between turns
terminal locations The length (LF) from the first test point to the ground fault is then read 1702 and the coil map (see FIG. 19) is generated 1703 using well-known computer graphic techniques. Control then returns to the calling routine.

Figure 18:
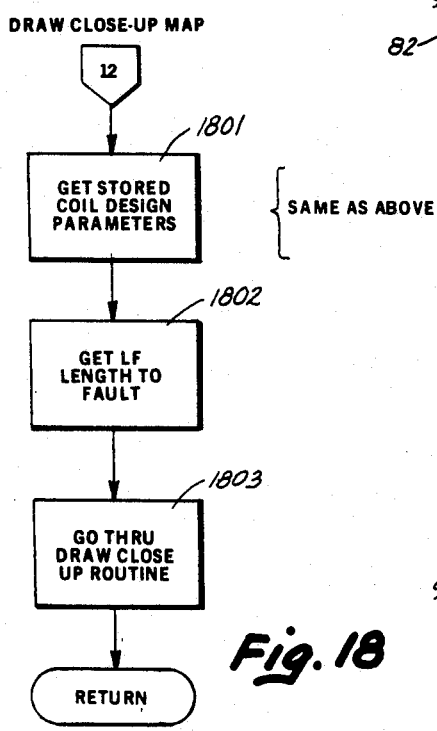
FIG. 18 is a flowchart of the "draw close-up map" routine.

The flowchart for the "draw close-up" routine is illustrated in FIG. 18. As in the previously described draw coil subroutine, the computer first retrieves 1801 the various coil design parameters and also retrieves 1802 LF before generating 1803 the actual close-up coil map (see FIG. 20). Control returns to the calling program after the coil map has been generated.

It should be understood that the above description is intended to be that of a preferred embodiment of the invention. Various changes and alterations might be made without departing from the spirit and broader aspects of the invention as set forth in the appended claims, which are to be interpreted in accordance with the principles of patent law, including the doctrine of equivalents.

The embodiments of the invention in which an exclusive property or privilege is claimed are defined as follows:

1. A method of locating a ground fault between first and second positions on an alternating current coil comprising the steps of:
   determining a first voltage potential between the first position and an electrical ground;
   determining a second voltage potential between the first position and the second position;
   calculating the ratio of said first voltage potential to said second voltage potential to provide an indication of the relative position of the ground fault on the coil; and
   adjusting said ratio by a value contained in a predetermined look-up table to compensate for variations in impedance throughout the length of the coil to improve the accuracy of the indications.

2. A method as defined in claim 1 further comprising the step of multiplying the length of the coil by said ratio to determine the distance between the first position and the ground.

3. A method as defined in claim 1 further comprising the steps of:
   monitoring values of other electric parameters related to the coil; and
   recording the values of said parameters when the ground fault is detected.

4. A method as defined in claim 1 wherein said coil comprises a power coil of an induction furnace.

5. A method as defined in claim 4 further comprising the steps of:
   generating a representation of the fault grounded coil turn;
   generating a representation of a furnace yoke; and
   generating a ground fault indicator superimposed on said coil turn and yoke representation to illustrate the location of the ground with respect to the coil turn and the yoke.

6. A device for detecting and determining the position of a ground fault between first and second positions on an alternating current coil, with mutual flux coupling between turns and therefore uneven impedance throughout its length, the first position having a higher voltage potential than the second position, said device comprising:
   means for measuring a first voltage between the first position and the second position;
   means for measuring a second voltage between the first position and an electrical ground; and
   computer means for determining the ratio of said second voltage to said first voltage to provide an indication of the relative position of the ground fault on the coil, said computer means including look-up table means for storing correction values to be applied to the ratios to compensate for variations in impedance along the length of the coil to improve the accuracy of the indication.

7. A device as defined in claim 6 wherein said coil comprises a power coil on a coreless induction furnace.

8. A device as defined in claim 6 wherein said computer means further includes means for multiplying the length of the coil by the ratio to determine the distance of the ground from the first position.

9. A device as defined in claim 6 further comprising:
   means for measuring values electrically related to the coil; and
   means for recording said values upon detection of the ground.

10. A device as claimed in claim 7 further comprising display means for generating a display illustrating the position of the ground fault on the coil, said display means comprising:
   means for generating a representation of the fault grounded coil turn;
   means for generating a representation of a furnace yoke; and means for generating a ground fault indicator superimposed on said coil turn and yoke representation to illustrate the location of the ground fault with respect to the coil turn and the yoke.

* * * * *

UNITED STATES PATENT AND TRADEMARK OFFICE
CERTIFICATE OF CORRECTION

PATENT NO. : 4,612,498

DATED : September 16, 1986

INVENTOR(S) : Daniel S. Smalley

It is certified that error appears in the above-identified patent and that said Letters Patent is hereby corrected as shown below:

Column 5, line 47;
"metal" should be --melt--.

Column 6, line 43;
" povide" should be --provide--.

Column 7, line 8;
"liners 6" should be --liners 16--.

Column 8, line 17;
"gorund" should be --ground--.

Column 8, line 29;
"vice verse" should be --vice versa--.

Column 8, line 31;
After "ground" insert --currents--.

Signed and Sealed this

Seventeenth Day of March, 1987

Attest:

DONALD J. QUIGG

Attesting Officer

Commissioner of Patents and Trademarks